(12) United States Patent
Kodama

(10) Patent No.: US 10,262,929 B2
(45) Date of Patent: Apr. 16, 2019

(54) SEMICONDUCTOR DEVICE WITH LEAD FRAME

(71) Applicant: LAPIS SEMICONDUCTOR CO., LTD., Kanagawa (JP)

(72) Inventor: Yuuki Kodama, Kanagawa (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 15/365,525

(22) Filed: Nov. 30, 2016

(65) Prior Publication Data

US 2017/0162478 A1 Jun. 8, 2017

(30) Foreign Application Priority Data

Dec. 3, 2015 (JP) .................. 2015-236841

(51) Int. Cl.
*H01L 23/495* (2006.01)
*H01L 21/56* (2006.01)
(Continued)

(52) U.S. Cl.
CPC ...... *H01L 23/49596* (2013.01); *H01L 21/565* (2013.01); *H01L 23/3114* (2013.01); *H01L 23/4952* (2013.01); *H01L 23/49503* (2013.01); *H01L 23/49541* (2013.01); *H01L 23/49548* (2013.01); *H01L 23/49575* (2013.01); *H01L 23/562* (2013.01); *H01L 24/49* (2013.01); *H01L 21/4825* (2013.01); *H01L 23/3121* (2013.01); *H01L 24/29* (2013.01); *H01L 24/32* (2013.01); *H01L 24/48* (2013.01); *H01L 24/73* (2013.01); *H01L 24/83* (2013.01); *H01L 24/85* (2013.01); *H01L 24/92* (2013.01); *H01L 2224/2919* (2013.01); *H01L 2224/32245* (2013.01); *H01L 2224/48091* (2013.01); *H01L 2224/48195* (2013.01); *H01L 2224/48247* (2013.01);
(Continued)

(58) Field of Classification Search
CPC ............... H01L 23/49503; H01L 24/49; H01L 23/3114; H01L 23/4952; H01L 23/49541; H01L 21/4825; H01L 21/565; H01L 23/562; H01L 23/49596; H01L 23/49575
USPC .................................................. 257/666, 676
See application file for complete search history.

(56) References Cited

U.S. PATENT DOCUMENTS

2002/0014691 A1* 2/2002 Yoon .................. H01L 23/49811
257/697
2005/0184374 A1* 8/2005 Ohe ..................... G02B 6/4206
257/678
(Continued)

FOREIGN PATENT DOCUMENTS

JP 2006-032775 2/2006
JP 2006-286920 10/2006
JP 2013-232550 11/2013

*Primary Examiner* — Shouxiang Hu
(74) *Attorney, Agent, or Firm* — Volentine, Whitt & Francos, PLLC

(57) ABSTRACT

A semiconductor device and a semiconductor device manufacturing method that may prevent positional displacement of an electronic component mounted on a lead frame. The semiconductor device includes a lead frame, and an electronic component that has a protruding or recessed structure at a bonding face that bonds to the lead frame and is bonded to the lead frame, in a state in which a portion of the lead frame is fitted together with the protruding or recessed structure.

6 Claims, 15 Drawing Sheets

(51) Int. Cl.
*H01L 23/31* (2006.01)
*H01L 23/00* (2006.01)
*H01L 21/48* (2006.01)

(52) U.S. Cl.
CPC .............. *H01L 2224/4912* (2013.01); *H01L 2224/49109* (2013.01); *H01L 2224/73265* (2013.01); *H01L 2224/83005* (2013.01); *H01L 2224/83192* (2013.01); *H01L 2224/85005* (2013.01); *H01L 2224/92247* (2013.01); *H01L 2924/19041* (2013.01); *H01L 2924/19105* (2013.01); *H01L 2924/19106* (2013.01); *H01L 2924/35121* (2013.01)

(56) References Cited

U.S. PATENT DOCUMENTS

| | | | |
|---|---|---|---|
| 2015/0381184 A1* | 12/2015 | Suzuki | H03B 5/04 331/156 |
| 2016/0118938 A1* | 4/2016 | Takemasa | H03L 1/022 331/154 |

* cited by examiner

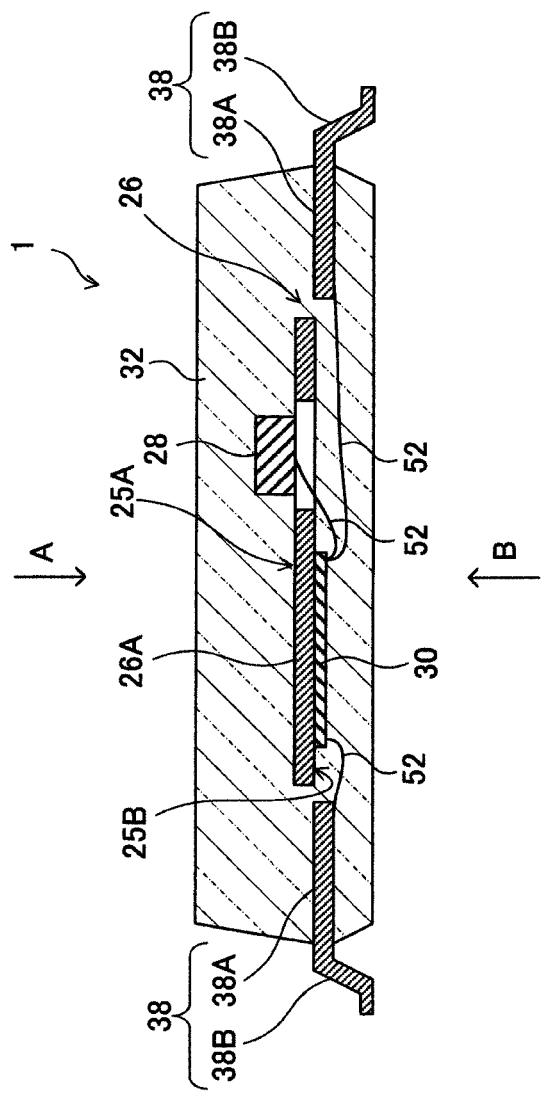

SEMICONDUCTOR DEVICE WITH LEAD FRAME

CROSS-REFERENCE TO RELATED APPLICATION

This application claims priority under 35 USC 119 from Japanese Patent Application No. 2015-236841, filed on Dec. 3, 2015, the disclosure of which is incorporated by reference herein.

BACKGROUND

Technical Field

The present disclosure relates to a semiconductor device and a semiconductor device manufacturing method.

Related Art

As described in Japanese Patent Application Laid-Open (JP-A) No. 2013-232550, for example, semiconductor devices are known in which an oscillator and a semiconductor chip with a timing circuit are encapsulated in molded resin.

Additionally, known technology for packaging electronic components mounted on a lead frame includes the following. For example, JP-A No. 2006-32775 describes a technology for bonding electronic components to recesses provided in a lead frame with conductive adhesive. Further, JP-A No. 2006-286920 describes technology in which electronic components are buried in recess provided in lead of a lead frame, and spaces between electrodes of the electronic components and walls of the recess are filled with solder so as to bond the electronic components and the leads.

In a resin encapsulation package like that described in JP-A 2013-232550, for example, in a resin encapsulation process, a lead frame onto which electronic components such as an oscillator have been mounted is housed in a mold and then molding resin is poured into the mold. In cases in which relatively tall electronic components such as an oscillator are mounted on the lead frame, the pressure applied to these electronic components when molding resin flows into the mold becomes larger, and the electronic components may be displaced. In a case in which positional displacement of the electronic components occurs, electrodes of the electronic components may contact the lead frame and cause malfunctions. Further, wires connected to the electrodes of the electronic components may also contact other wires or stress may act on the wires and lead to the wires disconnecting.

SUMMARY

The present disclosure provides a semiconductor device and a semiconductor device manufacturing method that may prevent positional displacement of electronic components mounted on a lead frame.

A first aspect of the present disclosure is a semiconductor device including: a lead frame; and an electronic component that has a protruding or recessed structure at a bonding face that bonds to the lead frame, and that is bonded to the lead frame in a state in which a portion of the lead frame is fitted together with the protruding or recessed structure.

A second aspect of the present disclosure is a semiconductor device manufacturing method including: bonding, to the lead frame, an electronic component including a protruding or recessed structure at a bonding face that bonds to a lead frame, in a state in which a portion of the lead frame is fitted together with the protruding or recessed structure.

According to the above aspects, the present disclosure provides a semiconductor device and a semiconductor device manufacturing method that may prevent positional displacement of electronic components mounted on a lead frame.

BRIEF DESCRIPTION OF THE DRAWINGS

Exemplary embodiments will be described in detail based on the following figures, wherein:

FIG. 1 is a cross-sectional view illustrating internal configuration of a semiconductor device according to an exemplary embodiment of the present disclosure;

DETAILED DESCRIPTION

Figure 2A:
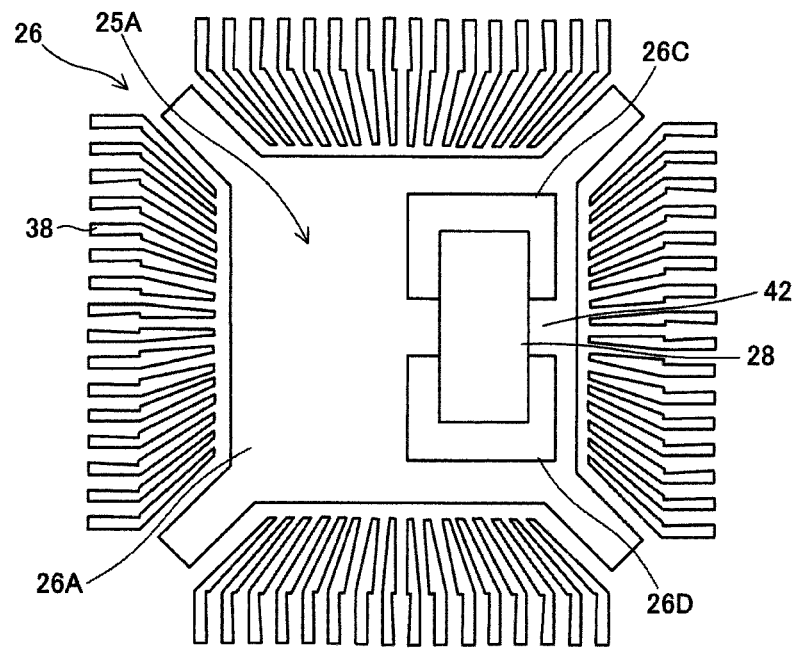
FIG. 2A is a plan view of a lead frame according to the exemplary embodiment, and electronic components mounted on the lead frame, as respectively viewed along arrow A illustrated in FIG. 1.

Explanation follows regarding exemplary embodiments of the present disclosure, with reference to the drawings. Note that in the drawings, elements and portions that are the same or are equivalent are appended with the same reference numerals, and duplicate explanation thereof is omitted, if appropriate.

First Exemplary Embodiment

Figure 2B:
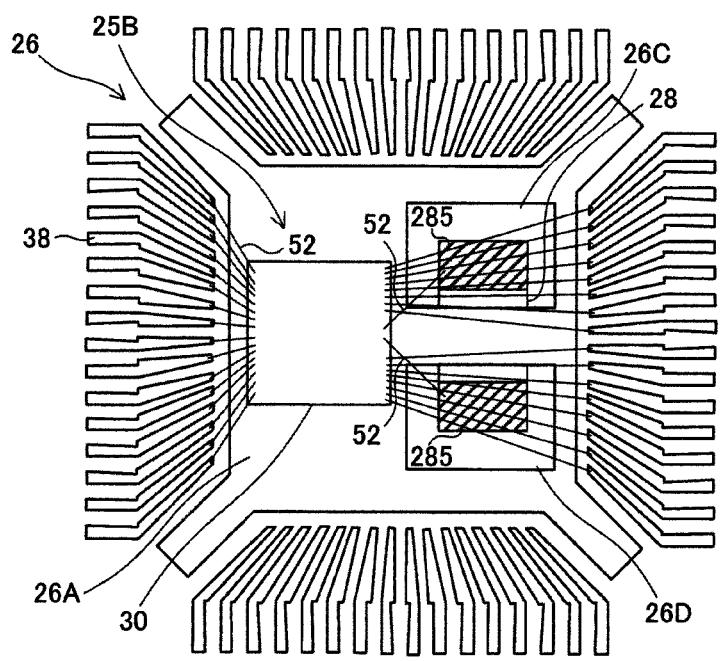
FIG. 2B is a plan view of a lead frame according to the exemplary embodiment, and electronic components mounted on the lead frame, as respectively viewed along arrow B illustrated in FIG. 1.

FIG. 1 is a cross-sectional view illustrating internal configuration of a semiconductor device 1 according to a first exemplary embodiment of the present disclosure. FIG. 2A is a plan view of a lead frame 26 configuring the semiconductor device 1, and electronic components mounted on the lead frame 26, as viewed along an arrow A direction illustrated in FIG. 1. FIG. 2B is a plan view of the lead frame 26, and electronic components mounted thereon, as viewed along an arrow B direction illustrated in FIG. 1.

The semiconductor device 1 has a rectangular outer shape in plan view, and is configured including the lead frame 26 that forms a frame, an oscillator 28, a semiconductor chip 30, and molding resin 32. The oscillator 28 is mounted on a first main face 25A of a die pad 26A configuring the lead frame 26. The semiconductor chip 30 is mounted on a second main face 25B of the die pad 26A on a side opposite to the first main face 25A. The molding resin 32 encapsulates the electronic components mounted on the die pad 26A.

The lead frame 26 is formed by punching out a flat plate made of a metal such as copper (Cu) or an iron (Fe) and nickel (Ni) alloy using a press. The lead frame 26 is configured including the die pad 26A and plural lead terminals 38.

The lead terminals 38 are configured including inner leads 38A that are buried inside the molding resin 32, and outer leads 38B that are exposed from the molding resin 32. As illustrated in FIG. 1, the inner leads 38A are pressed down by the press so as to be positioned lower than the die pad 26A, and the inner leads 38A extend parallel to the die pad 26A. Leading end portions of the inner leads 38A may be coated with a plating film made of silver (Ag) or the like.

The outer leads 38B are formed in what is known as a "gull wing" shape, in which middle portions of the outer leads 38B are bent downward and leading end portions of the outer leads 38B are bent so as to be parallel to the inner leads 38A. The outer leads 38B may be coated with a solder plating film.

As illustrated in FIG. 2A and FIG. 2B, the die pad 26A is a flat plate shaped portion that is formed with a rectangular shape in plan view. The die pad 26A includes rectangular shaped through holes 26C, 26D that penetrate from the first main face 25A to the second main face 25B. The through holes 26C and 26D are positioned side-by-side, and a strip shaped beam portion 42, this being a mounting region for the oscillator 28, is formed between the through holes 26C and 26D.

The oscillator 28 is bonded to the beam portion 42 on the first main face 25A side of the die pad 26A. The oscillator 28 is, for example, a surface mount crystal oscillator with an oscillation frequency of 32.768 kHz.

Figure 3:
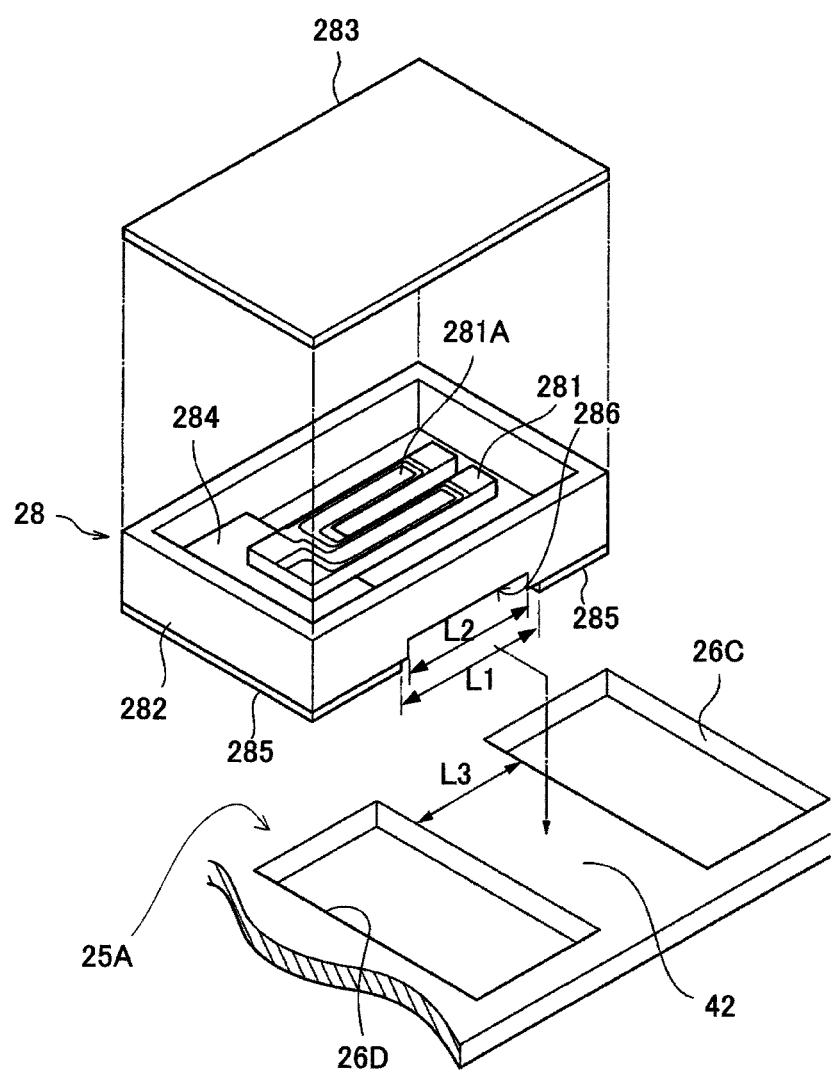
FIG. 3 is a perspective view illustrating a configuration of an oscillator according to an exemplary embodiment of the present disclosure.
Figure 4:
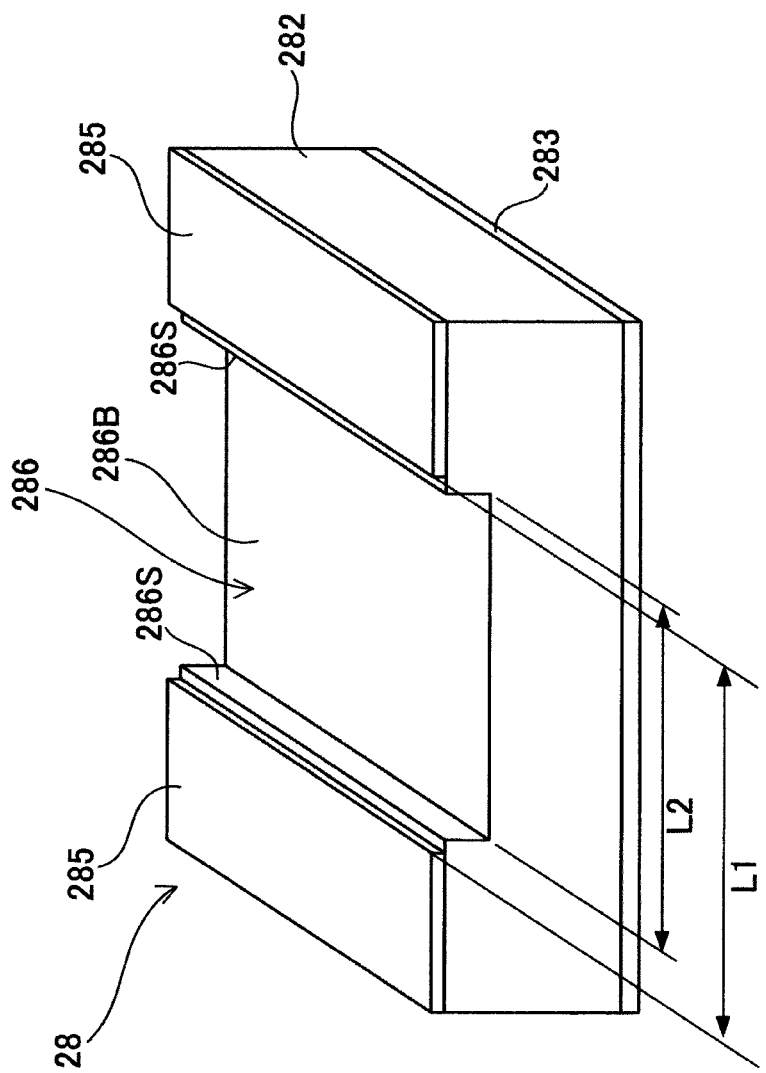
FIG. 4 is a perspective view illustrating configuration of a bonding face of an oscillator to a lead frame, according to an exemplary embodiment of the present disclosure.

FIG. 3 is a perspective view illustrating an example configuration of the oscillator 28. In FIG. 3, a portion of the die pad 26A in the vicinity of the beam portion 42 forms a mounting region for the oscillator 28 is illustrated together with the oscillator 28. FIG. 4 is a perspective view illustrating configuration of a bonding face of the oscillator 28 that bonds to the lead frame 26.

The oscillator 28 is configured including an oscillating piece 281, a cuboid case 282 that houses the oscillating piece 281, and a cover 283 that covers an open end of the case 282. The oscillating piece 281 is a crystal oscillating piece in which an excitation electrode 281A has been deposited onto the surface of a tuning fork shaped piece of crystal. When current flows through the excitation electrode 281A, the oscillating piece 281 oscillates due to the piezoelectric effect. An AT-cut crystal piece may be employed as the oscillating piece 281. Besides a crystal oscillating piece, an oscillating piece formed from lithium tantalate ($LiTaO_3$) or lithium niobate ($LiNbO_3$) may be employed as the oscillating piece 281. A MEMS oscillating piece formed form silicon may also be employed as the oscillating piece 281.

The case 282 is a box with an open upper face, and a pedestal 284, to which the oscillating piece 281 is fixed, is provided at a bottom face inside the case 282. The oscillating piece 281 is fixed to the pedestal 284, and the case 282 and the cover 283 are bonded so as to hermetically seal the oscillating piece 281. A pair of electrodes 285 that are electrically connected to the excitation electrode 281A are provided at both ends of the bonding face of the case 282 with a separation of a predetermined distance L1. The distance L1 between the electrodes 285 is larger than a width L3 of the beam portion 42 formed at the die pad 26A.

As illustrated in FIG. 4, a rectangular shaped recess (channel) 286 recessed toward the cover 283 side of the case 282 is provided at the bonding face of the oscillator 28 that bonds to the lead frame 26. The recess 286 is provided at the inside of the electrodes 285. A bottom face 286B of the recess 286 that is sunken inward with respect to the surfaces of the electrodes 285 is configured as a flat face. The bottom face 286B is a flat face that extends continuously at a constant height along a direction intersecting the alignment direction the electrodes 285 as far as the ends of the oscillator 28. Sidewalls 286S that are substantially vertical with respect to the bottom face 286B are provided at both ends along the alignment direction of the electrodes 285 of the bottom face 286B. A width L2 of the recess 286 along the alignment direction of the electrodes 285 is configured to be smaller than the distance L1 between the electrodes 285 and slightly larger than the width L3 of the beam portion 42 formed at the die pad 26A.

Figure 5:
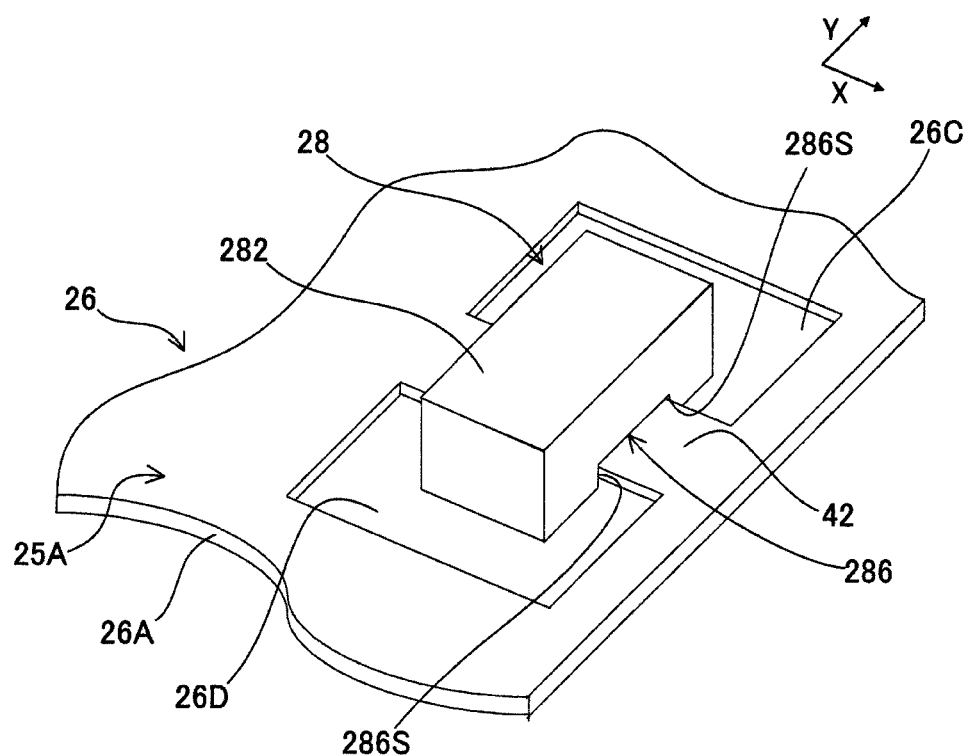
FIG. 5 is a perspective view illustrating a state in which an oscillator according to an exemplary embodiment of the present disclosure is mounted on a beam portion.

FIG. 5 is a perspective view illustrating a state in which the oscillator 28 has been mounted on the beam portion 42 of the die pad 26A. The oscillator 28 is bonded to the lead frame 26 in a state in which the beam portion 42 is fitted into the recess 286 formed at the bonding face that bonds to the lead frame 26. In other words, the oscillator 28 is bonded to the lead frame 26 in a state so as to sandwich the beam portion 42 between the mutually opposing sidewalls 286S of the recess 286. The oscillator 28 is adhered to the beam portion 42 by an adhesive interposed between the bottom face 286B of the recess 286 and the surface of the beam portion 42. The oscillator 28 is thus bonded to the first main face 25A of the die pad 26A in a state straddling the beam portion 42. Accordingly, as illustrated in FIG. 2B, the pair of electrodes 285 formed at both ends of the bonding face of the oscillator 28 are respectively exposed at the second main face 25B side of the die pad 26A via the through holes 26C and 26D.

As illustrated in FIG. 2B, the semiconductor chip 30 mounted on the second main face 25B of the die pad 26A is electrically connected through bonding wires 52, via the through holes 26C and 26D, to the electrodes 28S of the oscillator 28 exposed at the second main face 25B side of the die pad 26A. The semiconductor chip 30 is also electrically connected to the lead terminals 38 through the bonding wires 52.

The oscillator 28, the semiconductor chip 30, and the lead frame 26 are encapsulated by the molding resin 32. A thermoset epoxy resin containing a silica-based filling material may be used as the molding resin 32. A thermoplastic resin may also be used as the molding resin 32.

Figure 6:
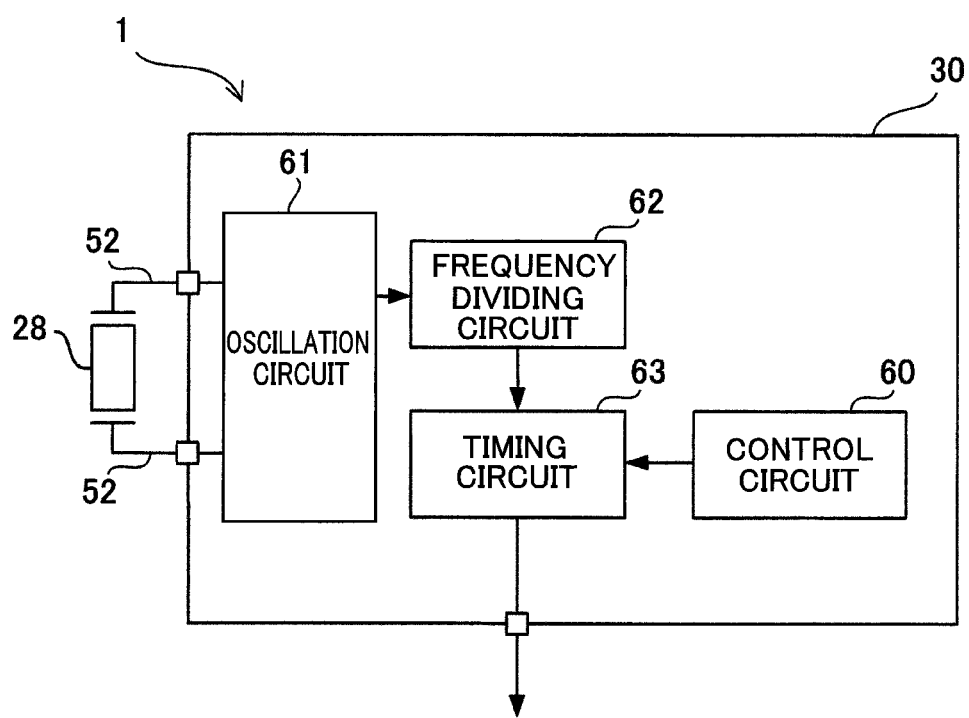
FIG. 6 is a circuit block diagram of a semiconductor device according to an exemplary embodiment of the present disclosure.

FIG. 6 is a circuit block diagram of the semiconductor device 1. An oscillation circuit 61, a frequency dividing circuit 62, a timing circuit 63, and a control circuit 60 are built into the semiconductor chip 30. The oscillation circuit 61 is electrically connected to the oscillator 28 through the bonding wires 52. The oscillation circuit 61 includes a capacitor that configures a resonating circuit together with the oscillator 28, and an amplifier and the like (not illustrated in the drawings) for maintaining oscillation. The oscillation circuit 61 generates an oscillating signal at a frequency of 32.768 kHz. The frequency dividing circuit 62 divides the oscillating signal output from the oscillation circuit 61 by 15, for example, to generate a 1 Hz clock signal. The timing circuit 63 corrects frequency shift in the clock signal output from the frequency dividing circuit 62 due to changes in the surrounding temperature and the like based on a frequency correction amount supplied from the control circuit 60, and outputs the corrected clock signal as a timing signal.

Explanation follows regarding a method of manufacturing the semiconductor device 1 according to an exemplary embodiment of the present disclosure. FIGS. 7A to 7C and 8A to 8C are cross-sectional views illustrating a method of manufacturing the semiconductor device 1.

Figure 7A:
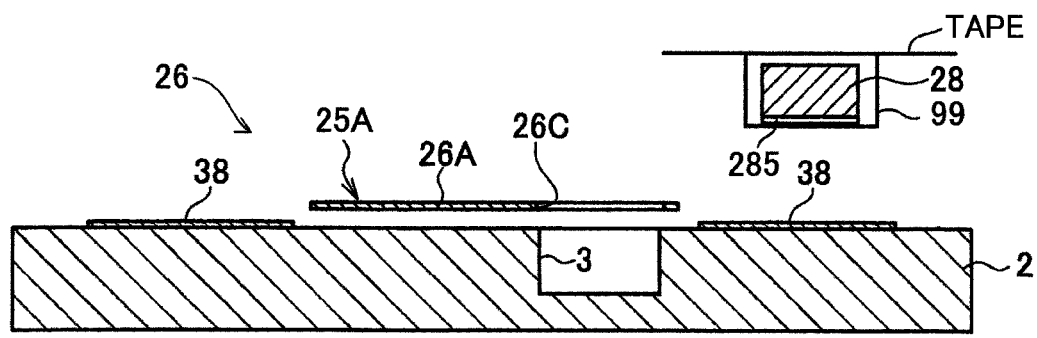
FIGS. 7A to 7C are cross-sectional views illustrating a semiconductor device manufacturing method according to an exemplary embodiment of the present disclosure.

First, as illustrated in FIG. 7A, the lead frame 26 is placed on a mounting table 2 of a bonding device such that the first main face 25A of the die pad 26A is facing upward. The oscillator 28 is conveyed enclosed in a taped package 99 in a state in which the electrodes 28S face downward.

Figure 7B:
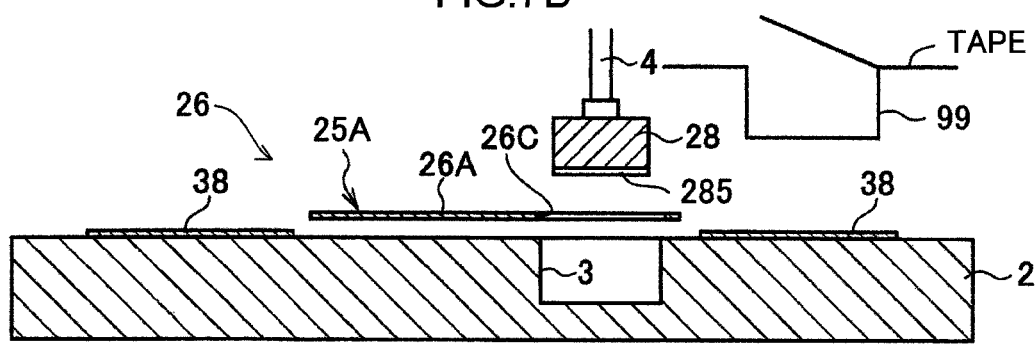

Next, adhesive is applied to the surface of the beam portion 42 on the first main face 25A side of the die pad 26A. Then, as illustrated in FIG. 7B, the oscillator 28 is picked up by a picker 4, and mounted on the beam portion 42 of the die pad 26A. The oscillator 28 is mounted on the beam portion 42, in a state in which the beam portion 42 is fitted into the recess 28G formed at the bonding face of the oscillator 28 that bonds to the lead frame 26.

Figure 7C:
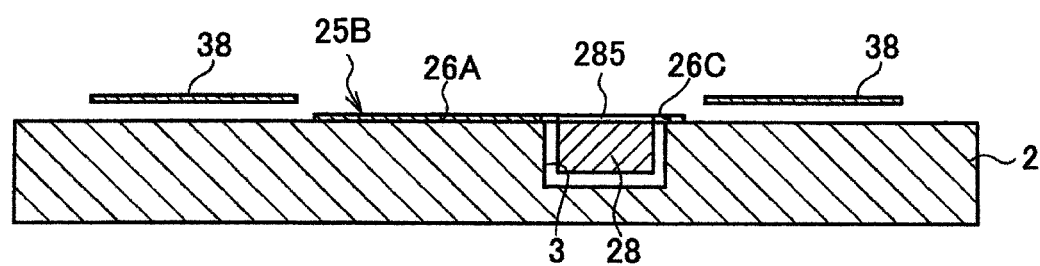

Next, as illustrated in FIG. 7C, the lead frame 26 is flipped over and placed on the mounting table 2. Namely, the lead frame 26 is placed on the mounting table 2 such that the second main face 25B of the die pad 26A faces upward. At this time, the oscillator 28 is housed in a depression 3 formed at the mounting table 2. The electrodes 28S of the oscillator 28 are exposed at the second main face 25B side of the die pad 26A via the through holes 26C and 26D.

Figure 8A:
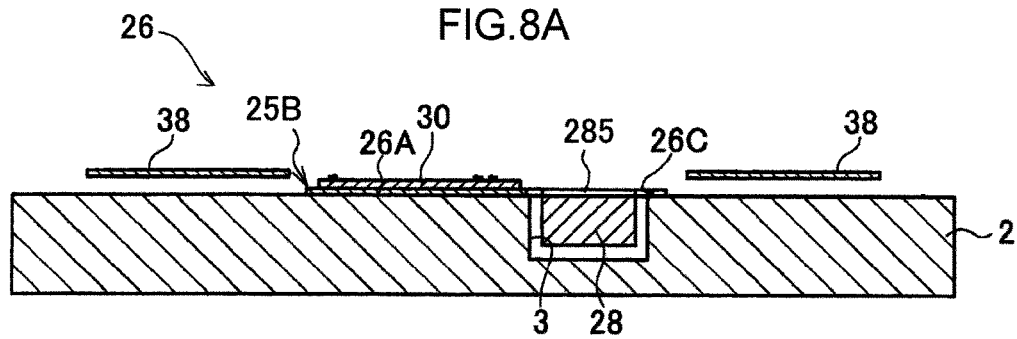
FIGS. 8A to 8C are cross-sectional views illustrating a semiconductor device manufacturing method according to an exemplary embodiment of the present disclosure.

Next, adhesive is applied to a mounting region for the semiconductor chip 30 on the second main face 25B of the die pad 26A. Then, as illustrated in FIG. 8A, the semiconductor chip 30 is mounted on the portion of the second main face 25B of the die pad 26A to which adhesive was applied.

Figure 8B:
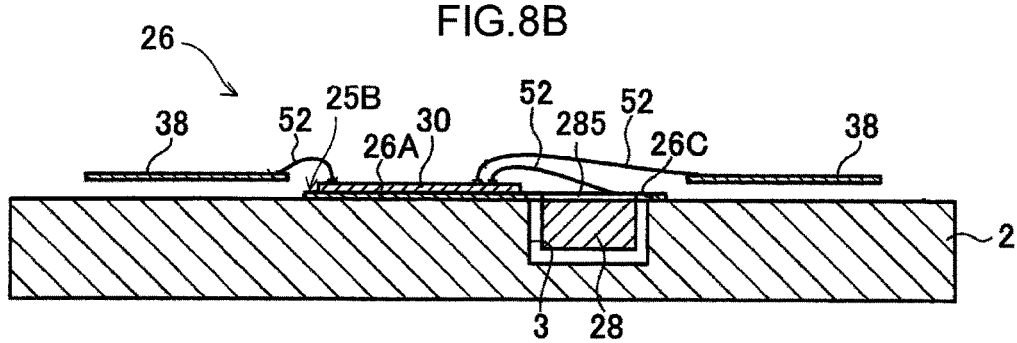

Next, as illustrated in FIG. 8B, the semiconductor chip 30 and the lead terminals 38 are connected by bonding wires 52. The semiconductor chip 30 and the electrodes 28S of the oscillator 28 are also connected by bonding wires 52.

Figure 8C:
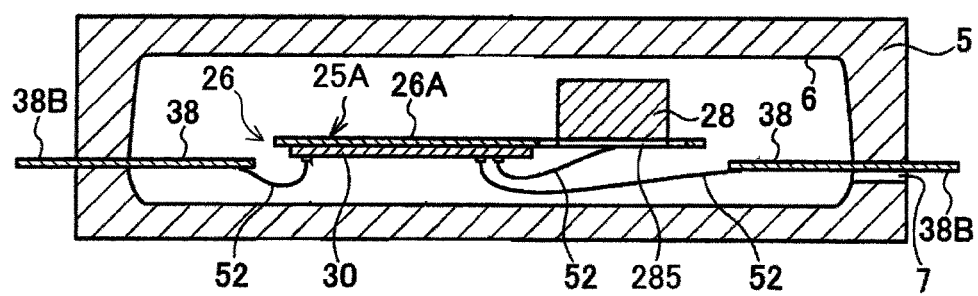

Next, as illustrated in FIG. 8C, the lead frame 26 is housed inside a cavity 6 of a mold 5 such that the first main face 25A of the die pad 26A faces upward. The lead frame 26 is housed inside the cavity 6 such that the outer leads 38B project to the outside of the mold 5. Then, the molding resin 32 is poured through an inlet 7 of the mold 5. After that, the mold is heated such that the molding resin 32 is hardened.

According to the method of manufacturing the semiconductor device 1 according to the exemplary embodiment of the present disclosure, as illustrated in FIG. 5, the oscillator 28 has the recess 28G on the bonding face that bonds to the lead frame 26, and the oscillator 28 is bonded to the lead frame 26 in a state in which the beam portion 42 of the lead frame 26 is fitted into the recess 28G. In other words, the oscillator 28 is bonded to the lead frame 26 in a state so as to sandwich the beam portion 42 between the mutually opposing sidewalls 28GS of the recess 28G. Thus, in a case in which molding resin 32 is poured into the mold 5, movement of the oscillator 28 in the direction in which the sidewalls 28GS of the recess 28G sandwich the beam portion 42 (the Y direction illustrated in FIG. 5) and in a rotational direction is restrained, even if pressure is applied to the oscillator 28. Accordingly, positional displacement of the oscillator 28 may be prevented.

Figure 9:
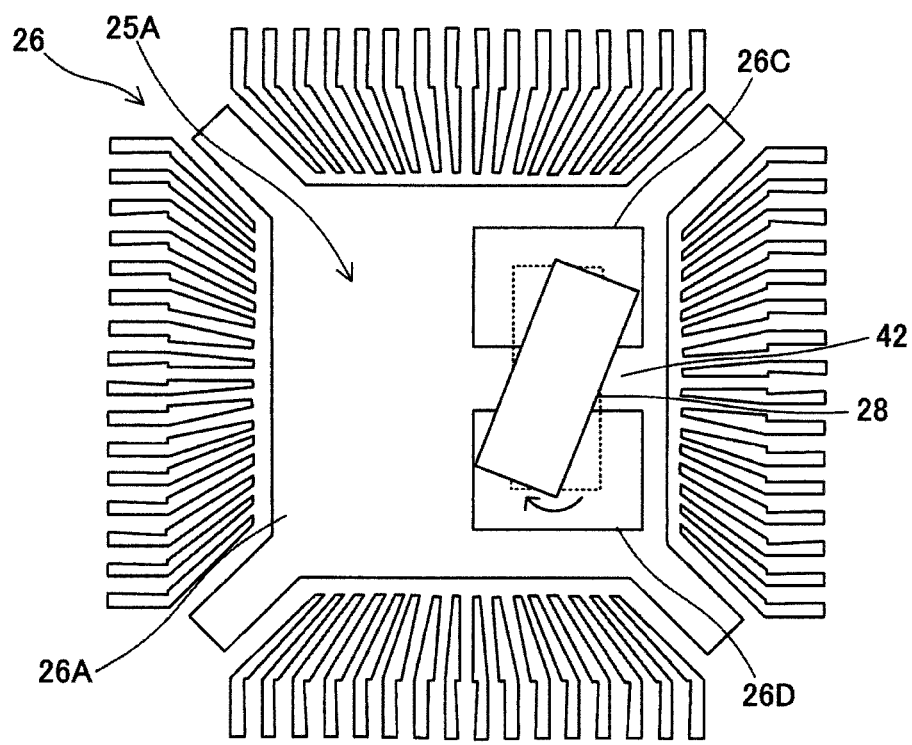
FIG. 9 is a plan view illustrating positional displacement of an oscillator.

FIG. 9 is a plan view illustrating an example of positional displacement of an oscillator 28 that may arise in a case in which a recess 28G is not formed at the bonding face of the oscillator 28 that bonds to a lead frame 26, and there is no structure to fit the oscillator 28 and the beam portion 42 together. In cases in which the oscillator 28 is configured to straddle the beam portion 42 provided between the through hole 26C and the through hole 26D, it is difficult to ensure the strength of the bond between the oscillator 28 and the lead frame 26 due to limitations to the bonding surface area between the oscillator 28 and the lead frame 26. Accordingly, as illustrated in FIG. 9, the oscillator 28 may rotate due to pressure applied on the oscillator 28 when molding resin 32 is poured into the mold 5, such that positional displacement occurs. Such positional displacement of the oscillator 28 may cause oscillation problems and make the timing circuit 63 (see FIG. 6) unable to output a timing signal with the proper frequency in cases in which the electrodes 28S of the oscillator 28 make contact with the lead frame 26. Positional displacement of the oscillator 28 may also apply stress to the bonding wires 52 linking the oscillator 28 and the semiconductor chip 30, causing wire peeling or wire breaks.

In contrast thereto, according to the method of manufacturing the semiconductor device 1 according to the exemplary embodiment of the present disclosure, positional displacement of the oscillator 28 may be prevented in the direction in which the sidewalls 28GS of the recess 28G sandwich the beam portion 42 (the Y direction in FIG. 5) and in a rotational direction, such that contact between the electrodes 28S of the oscillator 28 and the lead frame 26 can be prevented, and oscillation problems can be prevented. Additionally, the semiconductor device 1 according to the exemplary embodiment of the present disclosure may reduce stress applied to the bonding wires 52 due to positional displacement of the oscillator 28.

Second Exemplary Embodiment

Figure 10A:
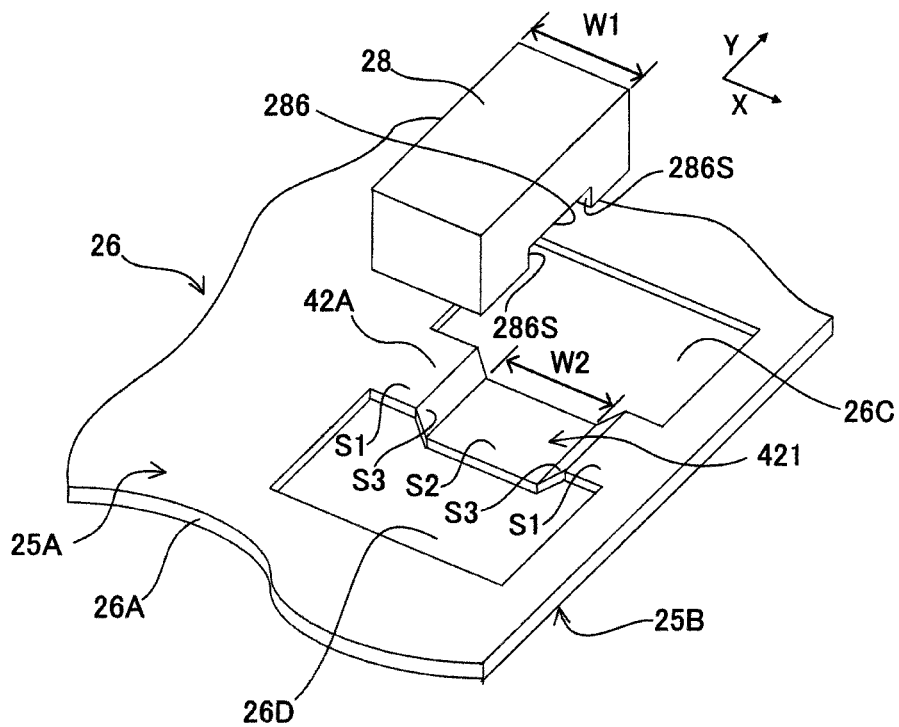
FIG. 10A is a perspective view illustrating the structure of a beam portion according to an exemplary embodiment of the present disclosure.

FIG. 10A is a perspective view illustrating the structure of a beam portion 42A formed at the lead frame 26 of a semiconductor device according to a second exemplary embodiment of the present disclosure. In FIG. 10A, the oscillator 28 to be mounted on the beam portion 42A is illustrated together with the lead frame 26. In the semiconductor device according to the second exemplary embodiment, the structure of the oscillator 28 is similar to that of the oscillator 28 according to the first exemplary embodiment, and includes the recess 286 on the bonding face of the oscillator 28 that bonds to the lead frame 26.

A recessed step portion 421 is provided at the center of the beam portion 42A along a direction (the X direction illustrated in FIG. 10A) intersecting the direction in which the sidewalls 286S of the recess 286 of the oscillator 28 sandwich the beam portion 42A (the Y direction illustrated in FIG. 10A). Namely, the beam portion 42A includes first faces S1 extending at the same height as the first main face 25A of the die pad 26A, a second face S2 extending to the lower side of (the second main face 25B side of) the first main face 25A, and side faces S3 that link the first faces S1 and the second face S2. The second face S2 is disposed at the X direction center of the beam portion 42A, and the first faces S1 and the side faces S3 are disposed at positions sandwiching the second face S2. A width W2 in the X direction of the second face S2 is configured equal to or slightly larger than a width W1 in the X direction of the oscillator 28. The side faces S3 disposed at both ends of the second face S2 are disposed so as to oppose one another in the X direction.

Figure 10B:
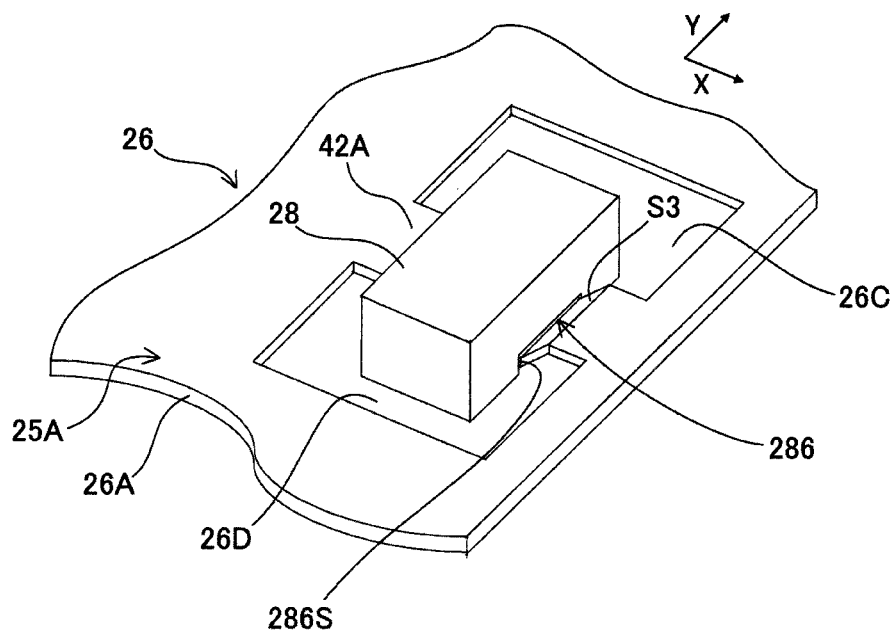
FIG. 10B is a perspective view illustrating a state in which an oscillator according to an exemplary embodiment of the present disclosure is mounted on a beam portion.

FIG. 10B is a perspective view illustrating a state in which the oscillator 28 is mounted on the beam portion 42A. The oscillator 28 is bonded to the lead frame 26 in a state in which the beam portion 42A is fitted into the recess 286 formed at the bonding face that bonds to the lead frame 26. More specifically, the oscillator 28 sandwiches the beam portion 42A in the Y direction between the sidewalls 286S of the recess 286, and is bonded to the lead frame 26 in a state so as to sandwich the side faces S3 of the beam portion 42A in the X direction. Namely, the oscillator 28 is bonded to the beam portion 42 in a state in which the recess 286 and the step portion 421 formed at the beam portion 42A are meshed together. The oscillator 28 is adhered to the beam portion 42A by an adhesive interposed between the bottom face of the recess 286 and the second face S2 of the beam portion 42A.

According to the semiconductor device according to the present exemplary embodiment, similarly to in the first exemplary embodiment, in a case in which molding resin 32 is poured into the mold 5, movement of the oscillator 28 in the Y direction and in the rotational direction is restrained by the recess 286 provided at the oscillator 28, even if pressure is applied to the oscillator 28. Moreover, according to the semiconductor device according to the present exemplary embodiment, movement of the oscillator 28 in the X direction is restrained due to the oscillator 28 being sandwiched between the side faces S3 of the step portion 421 formed at the beam portion 42A. Namely, according to the semiconductor device according to the present exemplary embodiment, positional displacement of the oscillator 28 in the X direction, the Y direction, and the rotational direction may be prevented.

Third Exemplary Embodiment

Figure 11A:
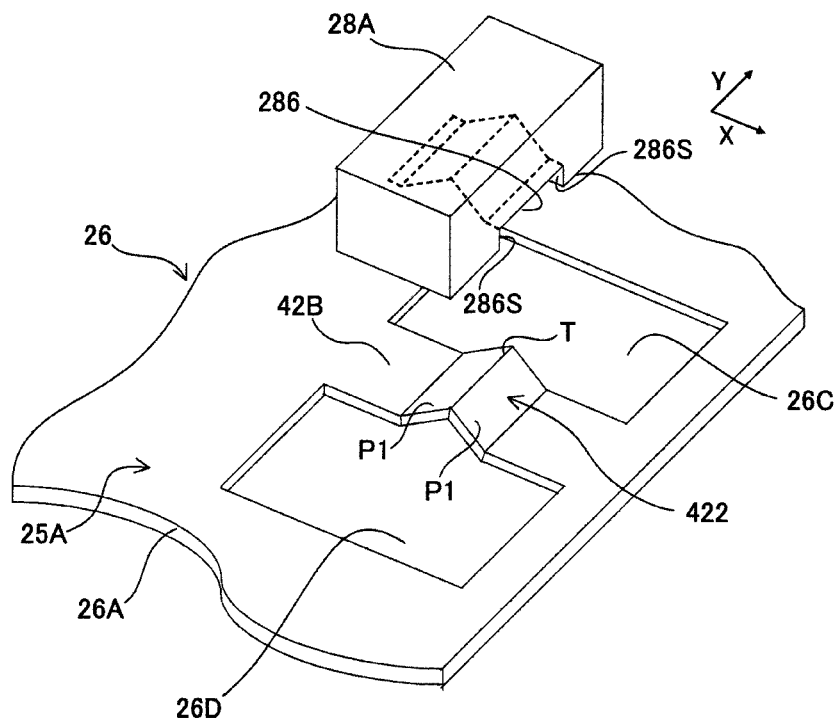
FIG. 11A is a perspective view illustrating the structure of a beam portion according to an exemplary embodiment of the present disclosure.
Figure 11B:
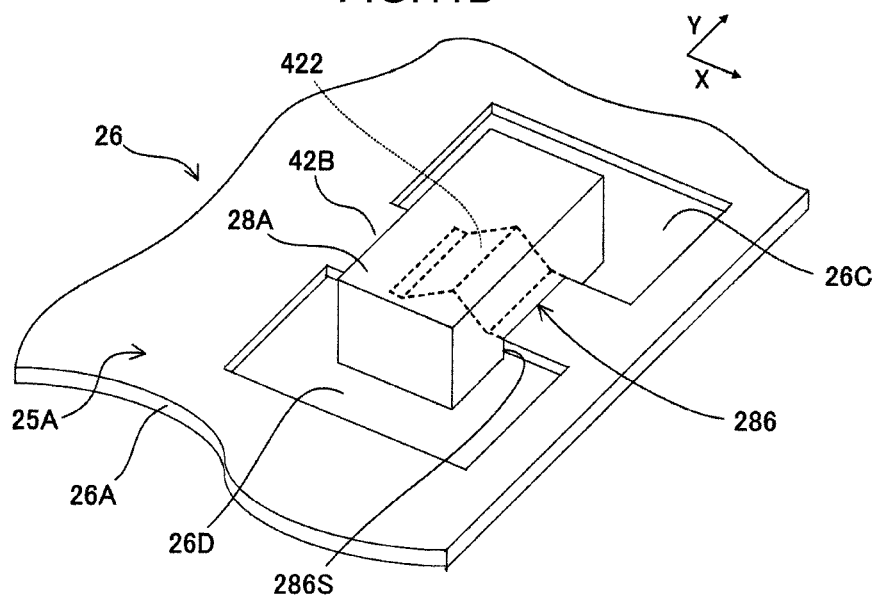
FIG. 11B is a perspective view illustrating a state in which an oscillator according to an exemplary embodiment of the present disclosure is mounted on a beam portion.
Figure 12:
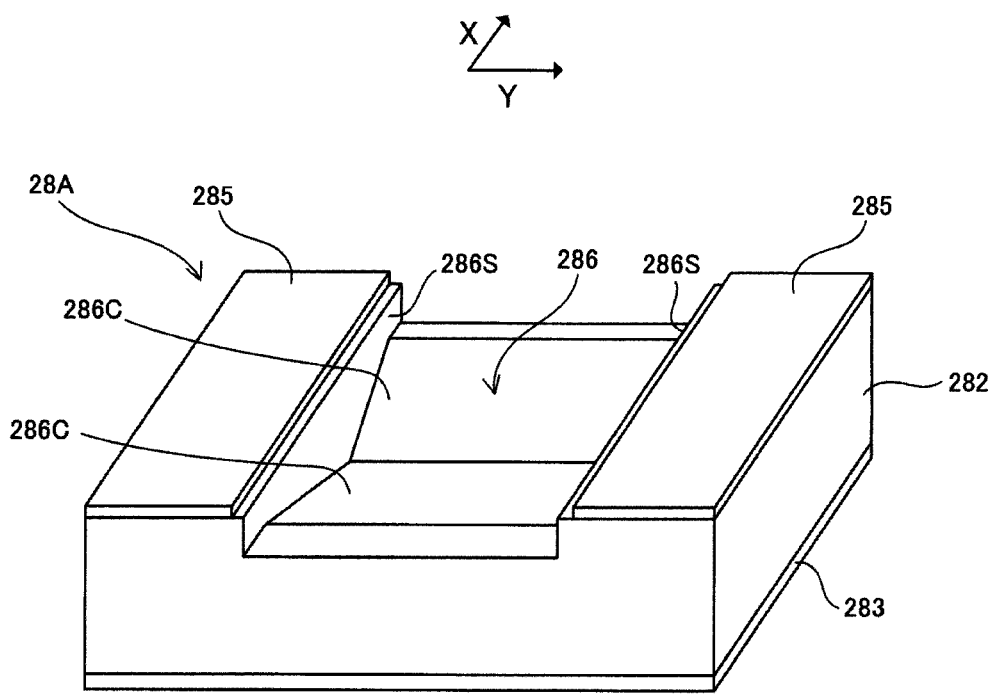
FIG. 12 is a perspective view illustrating configuration of a bonding face of an oscillator according to an exemplary embodiment of the present disclosure to a lead frame.

FIG. 11A is a perspective view illustrating the structure of a beam portion 42B formed at the lead frame 26 of a semiconductor device according to a third exemplary embodiment of the present disclosure. In FIG. 11A, an oscillator 28A to be mounted on the beam portion 42B is illustrated together with the lead frame 26. FIG. 11B is a perspective view illustrating a state in which the oscillator 28A is mounted on the beam portion 42B. FIG. 12 is a perspective view illustrating configuration of a bonding face of the oscillator 28A that bonds to the lead frame 26 according to the third exemplary embodiment of the present disclosure.

As illustrated in FIG. 11A, a protrusion 422 that protrudes upward from the first main face 25A of the die pad 26A is provided at the surface of the beam portion 42B. The protrusion 422 is disposed at the center of a direction (the X direction illustrated in FIG. 11A) intersecting the direction in which the sidewalls 286S of the recess 286 provided at the oscillator 28A sandwich the beam portion 42B (the Y direction illustrated in FIG. 11A). The protrusion 422 is configured including inclined faces P1 that are inclined so as to gradually increase in height on progression from the first main face 25A of the die pad 26A toward an apex T positioned at the X direction center of the beam portion 42B. Namely, the protrusion 422 presents a V shape as viewed in cross-section along the X direction.

As illustrated in FIG. 12, similarly to the oscillator 28 of the first exemplary embodiment, the oscillator 28A according to the present exemplary embodiment includes a recess 286 in the bonding face of the oscillator 28A that bonds to the lead frame 26. The shape of the bottom face of the recess 286 of the oscillator 28A differs from that of the oscillator 28 according to the first exemplary embodiment in that it corresponds to the protrusion 422 formed to the beam portion 42B. Namely, the bottom face of the recess 286 of the oscillator 28A includes V-shaped inclined faces 286C that correspond to the inclined faces P1 of the beam portion 42B.

As illustrated in FIG. 11B, the oscillator 28A is bonded to the lead frame 26 in a state in which the beam portion 42B is fitted into the recess 286 formed at the bonding face that bonds to the lead frame 26. More specifically, the oscillator 28A sandwiches the beam portion 42B between the sidewalls 286S of the recess 286, and is bonded to the lead frame 26 in a state in which the protrusion 422 formed to the beam portion 42B is fitted into the bottom face of the recess 286. Namely, the inclined faces P1 of the protrusion 422 formed to the beam portion 42B and the inclined faces 286C formed at bottom face of the recess 286 of the oscillator 28A are in close contact with each other.

According to the semiconductor device according to the present exemplary embodiment, similarly to in the first exemplary embodiment, when molding resin 32 is poured into the mold 5, movement of the oscillator 28A in the Y direction and in the rotational direction is restrained by the recess 286 provided at the oscillator 28A, even if pressure is applied to the oscillator 28A. Moreover, according to the semiconductor device according to the present exemplary embodiment, movement of the oscillator 28A in the X direction is restrained due to the protrusion 422 formed to the beam portion 42B being fitted into the recess 286. Namely, according to the semiconductor device according to the present exemplary embodiment, positional displacement of the oscillator 28A in the X direction, the Y direction, and the rotational direction may be prevented.

Note that, although in the present exemplary embodiment, the shape of the protrusion 422 formed to the beam portion 42B and the shape of the bottom face of the recess 286 formed at the oscillator 28A are V-shaped, there is no limitation thereto. Namely, with regards to the oscillator 28A and the beam portion 42B, any protruding or recessed structure capable of restricting movement of the oscillator 28A in the X direction may be formed to the bonding faces of the oscillator 28A and the beam portion 42B.

Fourth Exemplary Embodiment

Figure 13:
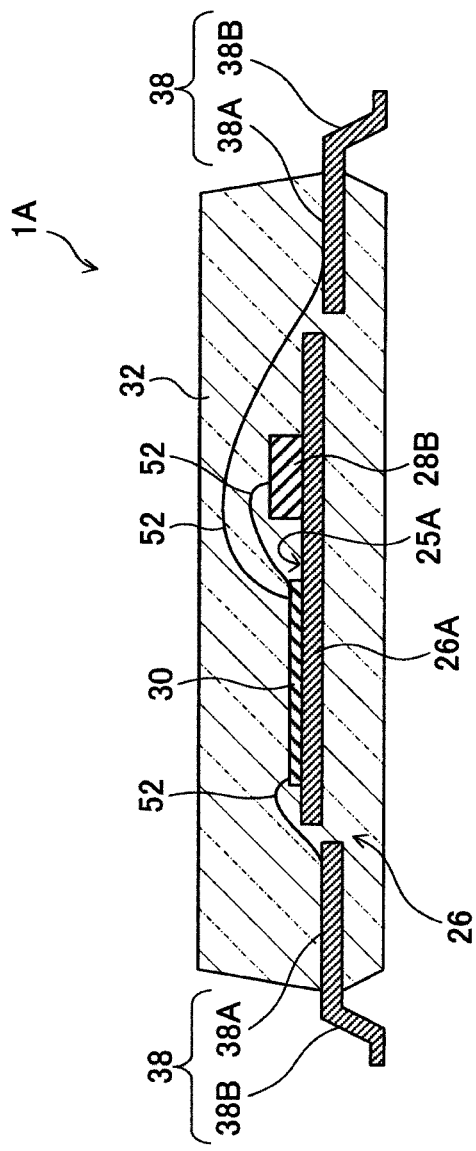
FIG. 13 is a cross-sectional view illustrating internal configuration of a semiconductor device according to an exemplary embodiment of the present disclosure.

FIG. 13 is a cross-sectional view illustrating internal configuration of a semiconductor device 1A according to a fourth exemplary embodiment of the present disclosure. In the semiconductor device 1A according to the present exemplary embodiment, the semiconductor chip 30 and an oscillator 28B are mounted on the first main face 25A of the lead frame 26 (die pad 26A). The semiconductor device 1A according to the present exemplary embodiment differs from the semiconductor devices according to the first to the third exemplary embodiments in that the die pad 26A is not provided with through holes or a beam portion.

Figure 14A:
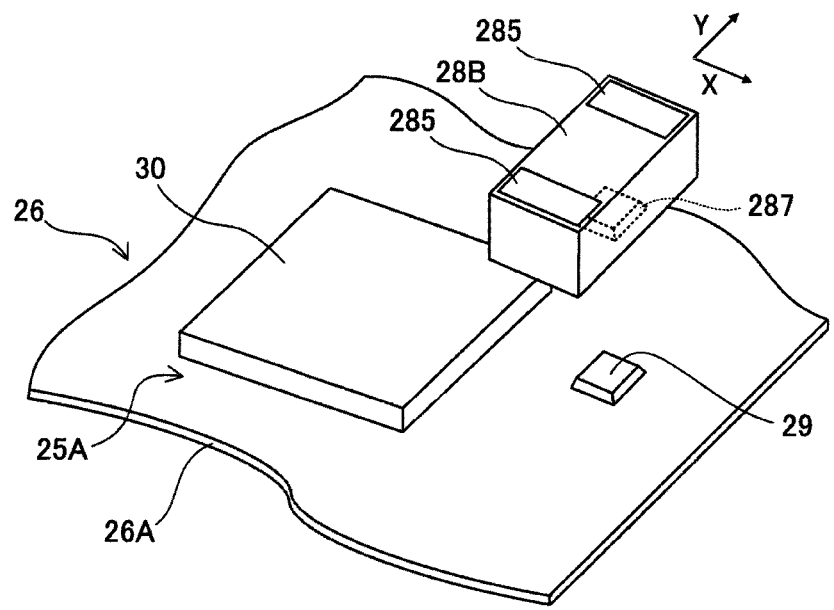
FIG. 14A is a perspective view illustrating configuration in the vicinity of a bonding portion of a lead frame according to an exemplary embodiment of the present disclosure to an oscillator.
Figure 14B:
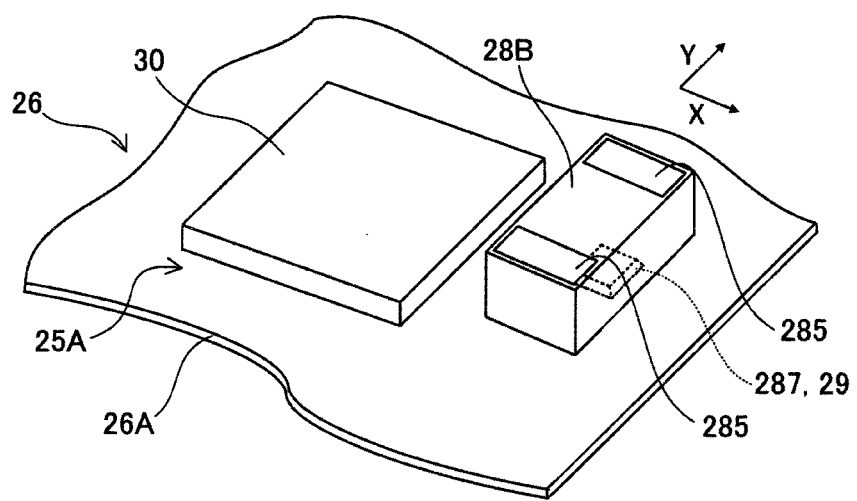
FIG. 14B is a perspective view illustrating a state in which an oscillator according to an exemplary embodiment of the present disclosure is mounted on a lead frame.
Figure 15:
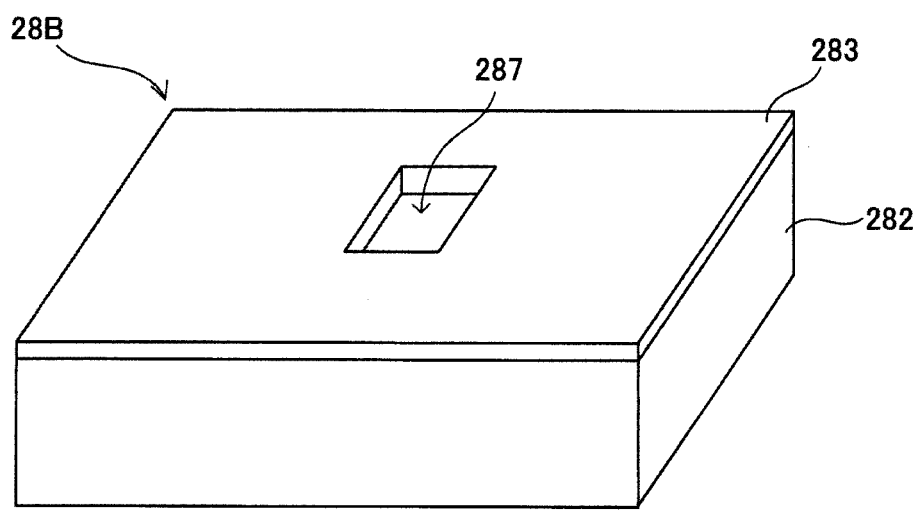
FIG. 15 is a perspective view illustrating configuration of a bonding face of an oscillator according to an exemplary embodiment of the present disclosure to a lead frame.

FIG. 14A is a perspective view illustrating configuration at the vicinity of a bonding portion of the lead frame 26 according to the present exemplary embodiment to the oscillator 28B. FIG. 14B is a perspective view illustrating a state in which the oscillator 28B is mounted on the lead frame 26 (die pad 26A). FIG. 15 is a perspective view illustrating configuration of a bonding face of the oscillator 28B according to the fourth exemplary embodiment of the present disclosure.

As illustrated in FIG. 14A, the die pad 26A of the lead frame 26 includes an angular column shaped, or truncated pyramid shaped, projection 29 that projects out from the first main face 25A onto which the semiconductor chip 30 and the oscillator 28B are mounted.

As illustrated in FIG. 15, an angular column shaped, or truncated pyramid shaped, sunken portion 287 that corresponds to the projection 29 provided at the lead frame 26 is provided at a central portion of the surface of the cover 283 that forms the bonding face of the oscillator 28 that bonds to the lead frame 26. The size of the sunken portion 287 in the length direction, the width direction, and the depth direction is configured slightly larger than the size of the projection 29 in each direction.

As illustrated in FIG. 14B, the oscillator 28B is mounted on the lead frame 26 in a state in which the electrodes 285, provided at the opposite side from the bonding face that bonds to the lead frame 26, are facing upward. The oscillator 28B is bonded to the lead frame 26 in a state in which the projection 29 formed to the lead frame 26 is fitted into the sunken portion 287 formed at the bonding face that bonds to the lead frame 26.

According to the semiconductor device according to the present exemplary embodiment, when the molding resin 32 is poured into the mold 5, positional displacement of the oscillator 28B in the X direction and the Y direction may be prevented due to the projection 29 provided at the lead frame 26 being fitted into the sunken portion 287 provided at the oscillator 28A, even if pressure is applied to the oscillator 28A. Moreover, positional displacement of the oscillator 28B in the rotational direction may be prevented due to the projection 29 and the sunken portion 287 each having an angular column shape, or a truncated pyramid shape. In the present exemplary embodiment, an example has been given in which there is one each of the sunken portion 287 and the projection 29. However, plural sunken portions 287 may be provided at the oscillator 28A, and plural projections 29 may be provided at the lead frame 26.

Note that it is also possible for a projection to be provided at the oscillator 28B and a sunken portion to be provided at the lead frame 26. However, in a case in which a sunken portion is provided at the lead frame 26, it becomes difficult to stably fix the lead frame 26 to the mounting table 2 of the bonding device in the process of mounting the oscillator 28B and the semiconductor chip 30 on the lead frame 26 since the bottom face of the lead frame 26 is not a flat face. However, using a configuration in which the sunken portion 287 is provided at the oscillator 28B and the projection 29 is provided at the lead frame 26, as in the present exemplary embodiment, enables the bottom face of the lead frame 26 to be configured as a flat face, thereby enabling the lead frame 26 to be stably fixed to the mounting table 2 of the bonding device in the process of mounting the oscillator 28B and the semiconductor chip 30 to the lead frame 26.

What is claimed is:

1. A semiconductor device comprising:
a lead frame; and
an electronic component that includes a case and a pair of electrodes provided on and in contact with a bonding face of the case that bonds the case to the lead frame, the case including a recess formed into the bonding face and between the pair of electrodes in a plan view, and the electronic component being bonded to the lead frame in a state in which a portion of the lead frame is fitted to the recess,
wherein the electronic component is an oscillator.

2. The semiconductor device of claim 1, wherein
the lead frame includes a beam portion formed between two through holes, and
the electronic component is bonded to the lead frame, in a state in which mutually opposing sidewalls of the recess sandwich the beam portion.

3. The semiconductor device of claim 2, wherein
the beam portion includes a recessed step portion in a bonding face of the beam portion that bonds to the electronic component, and
the electronic component is bonded to the lead frame, in a state in which the electronic component is sandwiched between mutually opposing sidewalls of the recessed step portion in a direction intersecting a direction that the sidewalls of the recess sandwich the beam portion.

4. The semiconductor device of claim 2, wherein
the beam portion includes a protrusion on a bonding face of the beam portion that bonds to the electronic component,
a bottom face of the recess of the electronic component has a shape corresponding to the protrusion, and
the electronic component is bonded to the lead frame, in a state in which the protrusion is fitted together with the bottom face of the recess.

5. The semiconductor device of claim 2, wherein the pair of electrodes are respectively exposed, via the through holes, to a face of the lead frame that is on an opposite side from a bonding face of the lead frame that bonds to the electronic component.

6. The semiconductor device of claim 5, further comprising a semiconductor chip that is provided at the face of the lead frame that is on the opposite side from the bonding face of the lead frame that bonds to the electronic component,
wherein the semiconductor chip and the pair of electrodes of the electronic component are connected by bonding wire.

* * * * *